United States Patent [19]
Gerard

[11] Patent Number: 4,532,480
[45] Date of Patent: Jul. 30, 1985

[54] HIGH POWER AMPLIFIER ARRANGEMENTS

[75] Inventor: Roger E. J. Gerard, Chelmsford, England

[73] Assignee: The Marconi Company Limited, Stanmore, England

[21] Appl. No.: 529,852

[22] Filed: Sep. 6, 1983

[51] Int. Cl.³ .............................................. H03F 3/60
[52] U.S. Cl. .................... 330/286; 330/277; 330/54
[58] Field of Search .................. 330/54, 277, 286, 53, 330/56

[56] References Cited

U.S. PATENT DOCUMENTS 4,263,559 4/1981 Ho ........................................ 330/286

Primary Examiner—James B. Mullins
Assistant Examiner—G. Wan
Attorney, Agent, or Firm—Spencer & Frank

[57] ABSTRACT

A high power amplifier arrangement utilizes a configuration which is similar to that of a distributed amplifier in which the capacitances of a plurality of individual amplifying devices form part of a delay line which couples together the amplifying device, so as to sum the output power. The invention enables amplifying devices, such as vacuum tubes or field effect transistors which have significant electrode capacitances, to be used to amplify wide band high frequency signals. Each amplifying device is provided with an associated output impedance having a value which is matched to that of the output delay line on to which it fits. The output delay line consists of a number of stages separated by power combiners connected to different respective amplifying devices. This configuration can be more efficient than a conventional distributed amplifier, and its use is more acceptable in conjunction with loads, such as antennas whose actual input impedance can differ somewhat from a nominal design value.

9 Claims, 5 Drawing Figures

HIGH POWER AMPLIFIER ARRANGEMENTS

BACKGROUND OF THE INVENTION

This invention relates to high power amplifier arrangements which are suitable for the amplification of electrical signals having frequencies which extend over a wide band. It is often necessary to provide a greater output power than can be generated by a single amplifier device, and thus a number of such devices are used in combination so that together the total power handling requirement can be met.

One form of high power amplifier arrangement which is capable of operating over a wide frequency band is that known as a distributed amplifier. Such amplifiers are particularly suitable for use with vacuum valves, as they take advantage of the valve electrode capacitances which are arranged to form part of input and output delay lines. Distributed amplifiers are described in our earlier U.K. Pat. Nos. 846,633 and 2,040,635B.

A disadvantage which can arise with a distributed amplifier is that, if it operates into a mismatched load, the voltage which builds up on the output delay line can be unacceptably high, and thus to allow for this possibility it may be necessary to operate such an amplifier at well below its theoretically possible maximum rating. The present invention seeks to provide an improved higher power amplifier arrangement.

SUMMARY OF THE INVENTION

According to this invention an amplifier arrangement includes a plurality of amplifying devices having their individual control terminals connected to different points along an input delay line which has a predetermined passband; and the output terminals of the amplifying devices being connected to different points along an output line which consists of separate, sequentially connected delay stages which have a predetermined passband; said points along the output line being so chosen that delays between said output terminals are substantially the same as the delays between the corresponding innput terminals; and wherein the impedances of said delay stages progressively reduce towards the output point at one end of the output line; and a power combiner positioned between each pair of adjacent delay stages and arranged to couple power from a respective amplifying device into said output line, said power combiner incorporating a load in which power is dissipated only if the powers fed to the two inputs of the power combiner are not in a predetermined porportion and phase.

Preferably each amplifying device is arranged to present to the power combiner an output impedance which is matched to the impedance of the output line.

Preferably again each amplifying device includes a solid state amplifying element having a mainly capacitive input impedance.

DESCRIPTION OF THE PREFERRED EMBODIMENTS

The invention is particularly suitable for amplifying a wideband electrical signal. The use of a distributed amplifier to amplify wideband high frequency signals, enables the gain to be increased, as it would otherwise be unacceptably low due to capacitance effects of the active amplifying devices used. In a distributed amplifier of the kind described for example in our U.K. Pat. No. 846,633, all of the amplifying devices act together, so as to constitute, in effect, a single amplifier and the correct phasing is preserved between the different amplifying devices by providing input and output delay lines having the correct passband and delay characteristics.

With valves both the input capacitance and the output capacitance limit gain. With field effect transistors it is mainly the input capacitance which is responsible for keeping the gain low, but being a low impedance device the capacitance associated with the output terminal does not generally have significant effect on the gain. In the illustrated embodiments of this invention, a number of amplifying devices are driven from the same input voltage. As the output power from the separate devices is summed, the overall gain of the combination is increased as the number of devices is increased.

Figure 1:
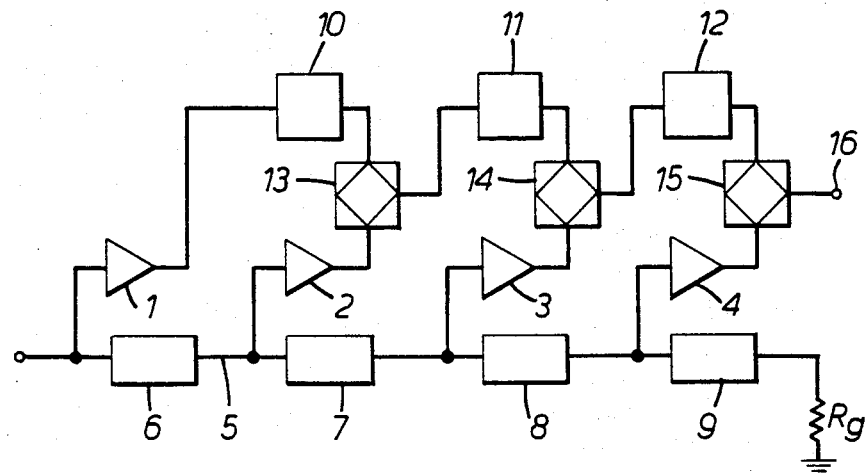
FIG. 1 shows in schematic form a high power amplifier arrangement in accordance with the invention.

FIG. 1 shows a high power amplifier arrangement in accordance with the invention, and which has a configuration related to that of a distributed amplifier, but it differs in that the outputs of the individual amplifying devices are fed independently on to an output line consisting of separate and independent delay stages. In FIG. 1, four individual amplifying devices 1, 2, 3 and 4 are connected in parallel and their input terminals are connected to respective points along an input delay line 5. In practice, the input delay line 5 is divided up into stages 6, 7 and 8, 9, but it behaves as a single unitary transmission line. Each of the amplifier devices 1, 2, 3 and 4 has an extremely high input impedance, so that essentially very little power is drawn from the input delay line, and it is not necessary to control the relative proportions of the total power which is drawn by the individual amplifying devices. Power incident on the input terminals travels along the delay line driving each active element in succession without loss, and is finally absorbed in the terminating resistance Rg. Thus all stages are driven to the same amount. Thus the input delay line 5 is identical to that of the conventional distributed amplifier. However, the output line of the amplifier consists of a number of separate delay stages 10, 11 and 12, which are quite distinct from each other and which are spaced apart by respective power combiners 13, 14 and 15. Furthermore, each amplifying device 1, 2, 3 and 4 is arranged such that it presents a predetermined matched output impedance to the power combiners. The matched output impedance could take the form of a basic resistive element, or could be simulated by other techniques such as described in our U.K. Pat. No. 1,088,251. The delay characteristics of the delay stages 10, 11 and 12 are arranged such that the outputs of the different amplifying devices combine constructively, and thus, in practice, the overall delay provided by the output line is the same as that provided by the input delay line 5.

If the arrangement shown in FIG. 1 feeds via an output port 16 into an antenna, or other utilisation device, having an impedance which is matched to the output impedance of the amplifier arrangement, the whole of the power will be transferred to the antenna. If, however, the two impedances are not perfectly matched, some power will be reflected back along the output delay line to the amplifying devices. In the case of the previously known distributed amplifiers, this reflected power causes high voltages to be generated along the line, with the voltage increasing with distance from the output point. The use, in this invention, of the power combiners 13, 14 and 15, together with the matched output impedance of the amplifying devices 1, 2, 3 and 4 ensures that reflected power is fed back equally to, and is absorbed by, the output impedance 24 of each amplifying device.

By way of contrast with conventional distributed amplifiers, it will be noted that no termination impedance is provided at the end of the output line which is remote from the output point apart from that associated with the first amplifying device—this avoids unnecessary dissipation of power.

The invention is particularly suitable for use with amplifying devices, which either consist wholly of field effect transistors (FET) or comprise composite devices having an FET input stage and FET or bipolar output stage. As is well known, an FET device has an extremely high input impedance, which is predominantly capacitive. Therefore its input capacitance can be so designed as to form an integral part of a loss-less input delay line 5.

Figure 2:
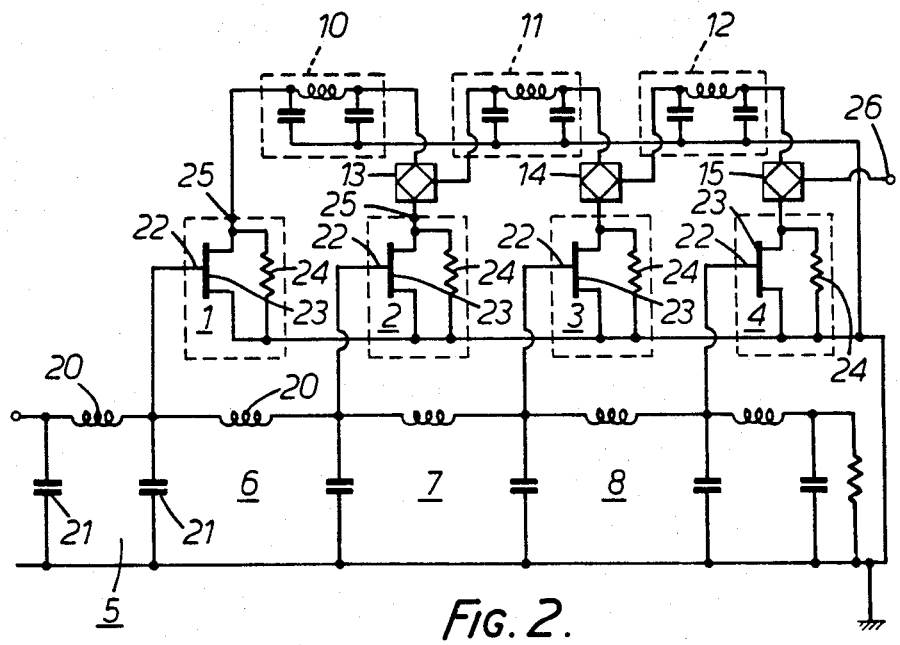
FIG. 2 shows one form of the arrangement in greater detail.

FIG. 2 shows in greater detail an amplifier having four individual amplifying devices, which are constituted as FET elements. So far as possible, the same reference numerals as FIG. 1 are used. The input delay line 5 consists of a number of individual stages comprising series inductors 20 and shunt capacitors 21. The gate electrodes 22 of FET 23 are connected to successive stages of the input delay line 5 in such a way that the gate capacitances of the FETs form part of the shunt capacitance 21 of the delay line. Each amplifying device 1, 2, 3 and 4 consists of a similar FET 23, and a resistance 24 which is connected between the source and drain electrodes, so as to enable the amplifying device to present a predetermined output impedance at its output terminal 25. The actual value of the resistance 24 determines the output impedance, which in this example is 50Ω for each amplifying device. The first amplifying device 1 feeds directly into the first delay stage 10, which is designed to exhibit a characteristic impedance of 50Ω. The output of the delay stage 10 is fed to a power combiner 13, having a second input which receives the output of the second amplifying device 2. Thus each input has a characteristic impedance of 50Ω and the combiner is arranged to have an output impedance of 25Ω, which feeds into the second delay stage 11 which itself had an equal characteristic impedance of 25Ω. The second combiner 14 has one input impedance of 25Ω, which is connected to the delay stage 11 and a second input impedance of 50Ω, which is connected to the output point of the third amplifying device 3. The third delay stage 12 has an impedance of 16.7Ω and this of course, corresponds to one input impedance of the final power combiner 15. The other input of the power combiner has the input impedance of 50Ω, so that the output impedance of the combiner 15 is 12.5Ω. The asymmetrical impedance of the power combiners 14 and 15 ensures that power is combined in the correct proportion, so that overall each of the four amplified devices 1, 2, 3 and 4 contributes the same amount of power to the output point 26. Thus each combiner (13, 14, 15) has a different coupling ratio. Hence the impedance of the output line decreases progressively towards the output point 26. Any number of devices may be combined this this technique.

Figure 3:
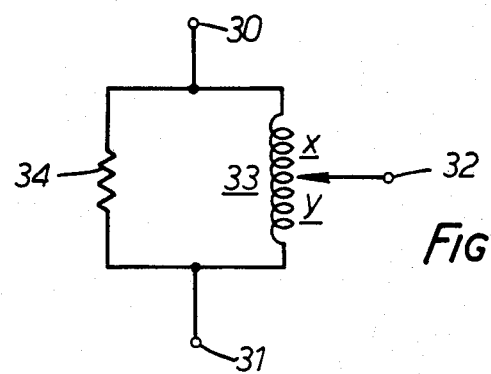
FIG. 3 shows a power combiner forming part of FIG. 2 in greater detail.

The nature of each power combiner 13, 14, 15 is more clearly indicated in FIG. 3. It has two input terminals 30, 31 and a single output terminal 32, and consists of a transformer 33 in shunt with a resistance 34. The combiner is essentially a hybrid transformer, in which under ideal conditions, the relative impedances x,y of the transformer windings on either side of the output tap point, are in the same proportion as the impedances of the external circuits connected to terminals 30, 31. Thus it acts to combine power in the correct proportion from the circuits external to it. If however, the power supplied is not in the correct balance, or is received via the output terminal 32, the out of balance power is dissipated within the resistance 34. Under ideal operating conditions essentially no power is lost in this resistance 34.

The circuit shown in FIG. 2 has a number of advantages as compared with a conventional distributed amplifier. For example, the failure of any one of the amplifying devices does not result in the complete failure of the whole amplifying arrangement. Instead, it can continue to operate at reduced power without serious degradation of performance. The percentage reduction of power output for the composite amplifier when operating into a mismatched load is the same as for a single amplifying device.

Figure 4:
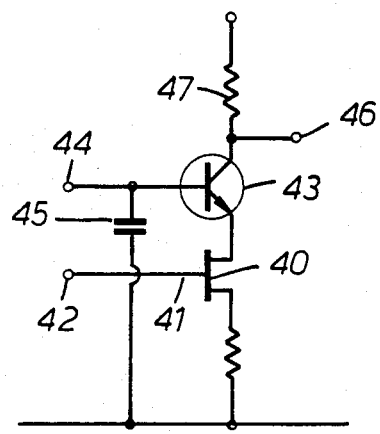
FIG. 4 shows an alternative form of an individual amplifying device.

Although, in FIG. 2, each amplifying device is shown as consisting only of an FET active element, other possibilities exist. In FIG. 4, a cascode amplifier device is illustrated in which an FET 40 has a gate electrode 41, connected to the input filter line 5, via a terminal 42. The FET 40 forms part of a cascode configuration, which also includes a bipolar transistor 43. In the manner of conventional cascode amplifiers, the base terminal of the bipolar transistors 43 receives a constant bias potential, via a terminal 44, which is capacitively connected to ground via a capacitor 45. the output of the amplifier device is taken from point 46, which is positioned between the collector of the bipolar transistor 43 and a source resistor 47, which determines the output impedance of the amplifying device as a whole.

Figure 5:
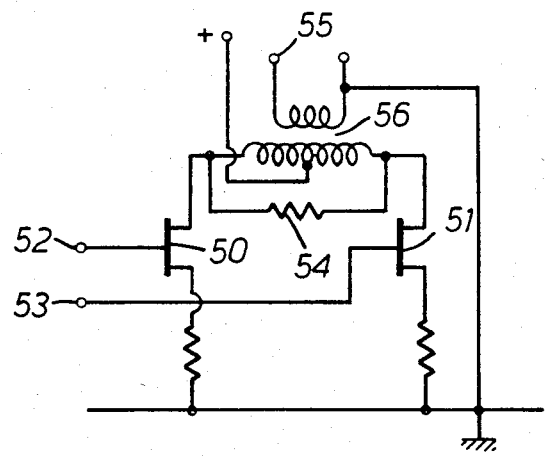
FIG. 5 shows a modified power combiner adapted for push-pull operation.

Distortion due to second harmonics can be cancelled by a push-pull configuration. A suitable layout for an amplifying stage is shown in FIG. 5, in which each amplifier has a balanced input and an unbalanced output. Thus such an amplifier arrangement has two input delay lines, but only a single output line. The two FETs 50 and 51 are connected to respective input filter lines via terminals 52, 53, and a source resistance 54 ensures that a matched output impedance is supplied to an output terminal 55. The transformer 56 combines the outputs of the FETs 50, 51. Each stage of the kind shown in FIG. 5 would be coupled onto an output line consisting of delay stages separated by power combiners, in an analogous manner to FIG. 1.

What is claimed is:
1. An amplifier arrangement including a plurality of amplifying devices having their individual input termi- nals connected to different points along an input delay line which has a predetermined passband; and the output terminals of the amplifying devices being connected to different points along an output line which consists of separate, sequentially connected delay stages each having an impedance and which have a predetermined passband; said points along the output line being so chosen that delays between the output terminals of a pair of amplifying devices are substantially the same as the delays between the input terminals of the pair of amplifying devices; and wherein the impedances of said delay stages progressively reduce as the sequence of delay stages approaches an output point at one end of the output line; and a power combiner positioned between each pair of adjacent delay stages and arranged to couple power from a respective amplifying device into said output line, said power combiner incorporating a load in which power is dissipated only if the powers fed to the two inputs of the power combiner are not in a predetermined proportion and phase.

2. An arrangement as claimed in claim 1 and wherein each amplifying device is arranged to present a predetermined output impedance which is matched to the appropriate impedance value of the output line.

3. An arrangement as claimed in claim 1 and wherein the power combiners are arranged so that each amplifying device feeds the same power level on to the output line.

4. An arrangement as claimed in claim 1 and wherein each amplifying device has a high input impedance such that the power gain of the arrangement is substantially proportional to the number of amplifying devices.

5. An arrangement as claimed in claim 1 and wherein each amplifying device comprises means for dissipating power reflected along the output line.

6. An arrangement as claimed in claim 1, and wherein each amplifying device includes an active amplifier element having a predominantly capacitive input impedance.

7. An arrangement as claimed in claim 6 and wherein said active amplifier elements are field effect transistors.

8. An arrangement as claimed in claim 1 and wherein each power combiner includes a transformer winding in shunt with a resistance in which power is dissipated only if the powers fed to two inputs of the power combiner are not in a predetermined proportion and phase.

9. An arrangement as claimed in claim 8 and wherein the two ends of the transformer winding constitute the two inputs of the power combiner, and its output is provided by a tap point on the winding, the position of the tap point along the winding determining the relative magnitudes of the powers accepted at its two inputs.

* * * * *